United States Patent [19]

Widlar

[11] 4,228,404
[45] Oct. 14, 1980

[54] LOW VOLTAGE COMPOUND INVERTER BUFFER CIRCUIT

[75] Inventor: Robert J. Widlar, Puerto Vallarta Jalisco, Mexico

[73] Assignee: National Semiconductor Corporation, Santa Clara, Calif.

[21] Appl. No.: 8,987

[22] Filed: Feb. 5, 1979

[51] Int. Cl.³ ............................................. H03F 3/30
[52] U.S. Cl. .................................. 330/267; 330/288; 330/296; 330/311
[58] Field of Search ............... 330/263, 267, 288, 296, 330/297, 307, 310, 311

[56] References Cited
FOREIGN PATENT DOCUMENTS
1908753 8/1970 Fed. Rep. of Germany ........... 330/311

OTHER PUBLICATIONS

Edwards, "Playmaster 143", *Electronics Australia*, Oct. 1974, pp. 76, 77, 79-81, 83.

*Primary Examiner*—James B. Mullins
*Attorney, Agent, or Firm*—Gail W. Woodward

[57] ABSTRACT

An integrated circuit gain block is obtained by cascading a common collector stage with a complementary common emitter stage. The current density of the common emitter transistor is made sufficiently greater than that of the common collector transistor so that the common emitter $V_{BE}$ lowest worst case value is higher than the common collector $V_{BE}$ highest worst case value. This makes the circuit manufacturable in integrated circuit form and permits the circuit to operate from a single power supply potential that can be as low as the series combination of one $V_{BE}$ added to one transistor collector to emitter saturation voltage. The circuit has a high current gain and is amenable to incorporation into current boosted class B amplifier output stages.

6 Claims, 3 Drawing Figures

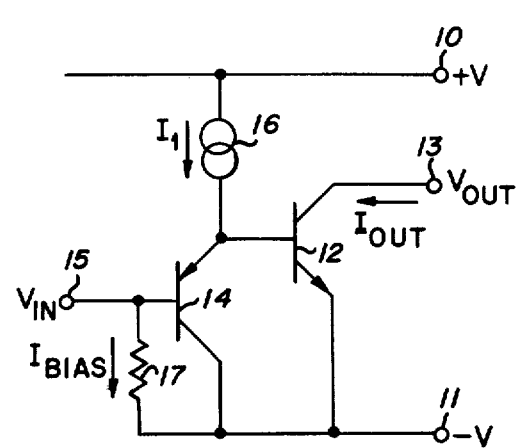
Fig_1
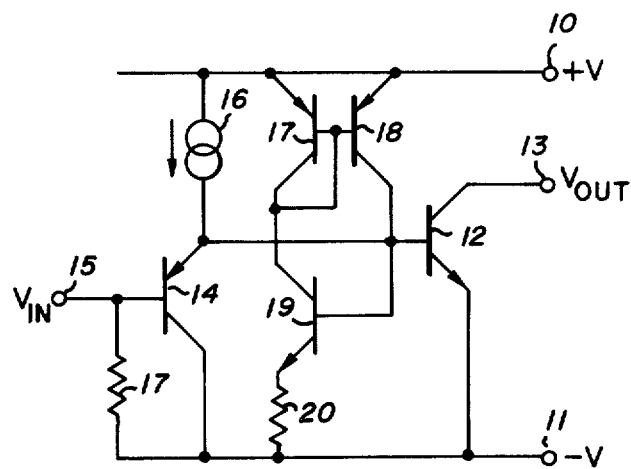
Fig_2
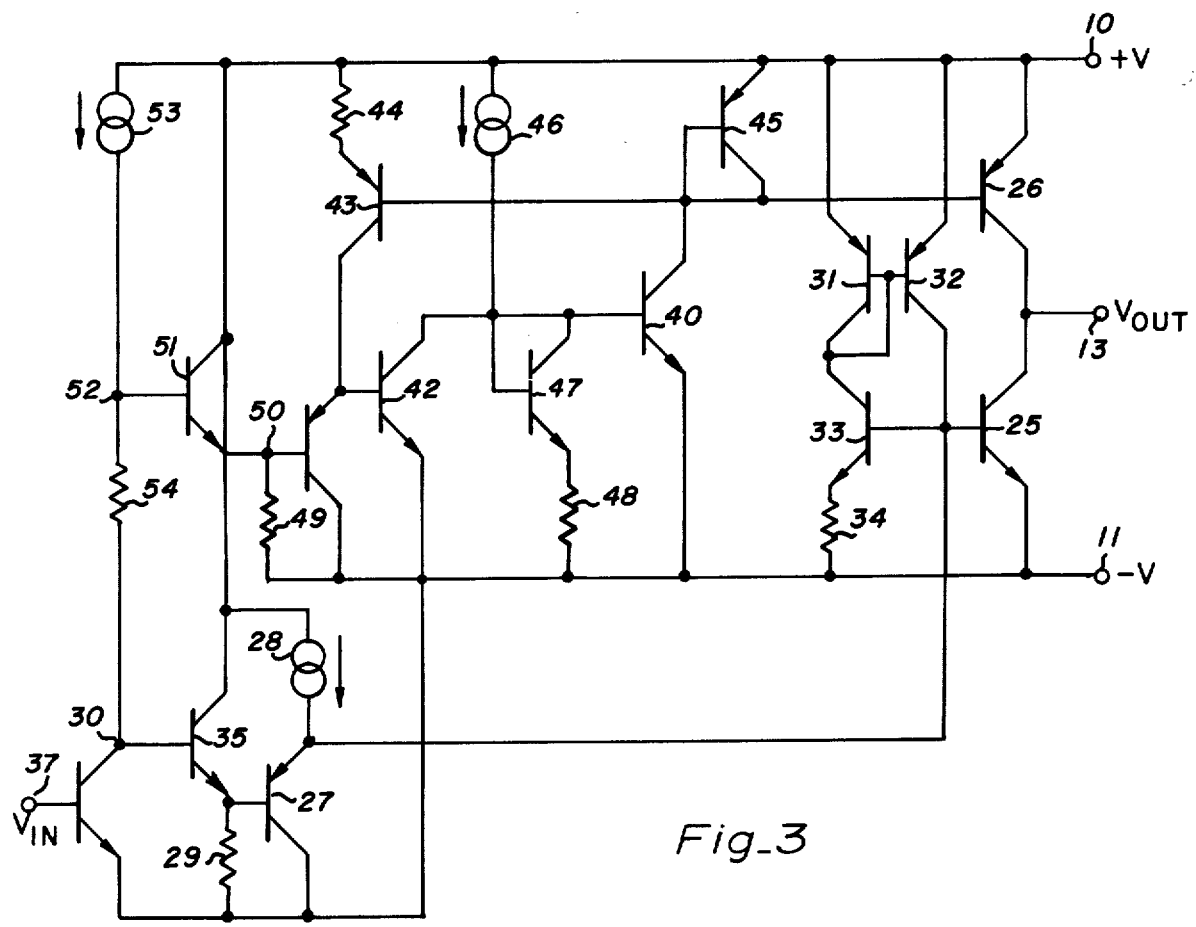
Fig_3

LOW VOLTAGE COMPOUND INVERTER BUFFER CIRCUIT

BACKGROUND OF THE INVENTION

The invention relates generally to monolithic integrated circuits (ICs) and in particular to a buffer inverter amplifier that permits the design of ICs that operate at very low supply voltages as well as the higher voltages that are normally associated with such devices.

In the typical IC the well-known Darlington connected transistor amplifier is usually employed where very high current gain buffering is desired. If signal inversion is also desired, the output is taken from a load coupled to the commonly connected transistor collectors. In effect, the Darlington connected transistors act as a single transistor having a current gain approximating the product of the current gain of the individual devices.

While such circuits work very well, the supply voltage must be at least two $V_{BE}$ values plus one $V_{SAT}$ for a two-transistor configuration. For three transistors, the level must be greater than $3V_{BE}+V_{SAT}$. Thus, over a reasonable temperature range the minimum supply voltage will be about 1.9 and 2.75 volts respectively for the two and three transistor versions. In terms of battery operated circuits, this means that one cell operation is ruled out.

In the prior art, a close approach to the present invention is found in Jochems U.S. Pat. No. 2,874,232. Here the attempt was to fabricate a two-transistor monolithic amplifier device. In one embodiment, Jochems discloses an emitter follower stage directly coupled to a common emitter stage which includes a biasing network in its emitter. The biasing network complicates the circuit realization as a practical matter and is necessary to maintain the desired operating potentials.

SUMMARY OF THE INVENTION

It is an object of the invention to provide a compound buffer inverter circuit that provides high current gain and operates usefully from a power supply as low as one $V_{BE}+V_{SAT}$.

It is a further object of the invention to provide a compound buffer inverter circuit that can be operated in conjunction with a current drive booster circuit.

It is still further object of the invention to provide a compound buffer inverter circuit that can be incorporated directly into a class B amplifier output stage to create an integrated circuit capable of operation at very low supply voltages and at low idling current.

These and other objects are achieved in a basic two transistor compound buffer inverter circuit configured as follows. A pair of complimentary transistors are cascaded so that a common collector stage drives a common emitter stage. The combination will display a current gain substantially that of a Darlington connected pair. The transistors are operated at current densities to guarantee that the common emitter device has a $V_{BE}$ that exceeds the $V_{BE}$ of the common collector stage. The resulting $\Delta V_{BE}$ will not change sign regardless of the transistor variables that result from a practical manufacturing process. Thus, the circuit is manufacturable using conventional IC processes.

Where a large output current is desired from the collector of the common emitter transistor, a conventional current booster can be directly connected to the base of the common emitter transistor. Such an arrangement is useful where the common emitter transistor to be used as one half of a class B output stage. In this configuration the output terminal can be driven to within $V_{SAT}$ of the power supply rail potential. Such a circuit can also be operated at a very low idling current which makes it nearly ideal for battery operation.

BRIEF DESCRIPTION OF THE DRAWING

FIG. 1 is a schematic diagram of the basic compound buffer inverter;

FIG. 2 is a schematic diagram of the compound buffer inverter with a current boost circuit; and FIG. 3 is a class B output amplifier using the circuitry of the invention.

DESCRIPTION OF THE INVENTION

FIG. 1 shows the basic circuit of the invention. A two transistor compound buffer inverter is operated from power supply terminals 10 (for $+V$) and 11 (for $-V$). A common emitter connected NPN transistor 12 drives output terminal 13 as a current sink for $I_{OUT}$. Emitter follower connected PNP transistor 14 acts as a buffer which drives the output stage. Terminal 15 comprises the input. A constant current source 16 supplies $I_1$ to transistor 14. Transistor 12 is the conventional IC device of vertical junction isolated construction. Transistor 14 is of the conventional collector substrate vertical construction well-known in IC designs. To be operative using a single supply, the circuits requires that the emitter current density of transistor 12 be greater than that of transistor 14. Thus $\Delta V_{BE}$, which equal the $V_{BE}$ of transistor 14 subtracted from the $V_{BE}$ of transistor 12, appears across resistor 17 which acts to bias transistor 14. These conditions can be established by first determining the design parameters for $I_1$ and $I_{OUT}$ and then geometrically setting the current density ratios by selecting the relative sizes of the emitters of transistors 12 and 14. As a practical matter, it is well-known that the transistor $V_{BE}$ values vary with IC fabrication parameters. The circuit design can be selected so that the highest production values encountered for the PNP transistor $V_{BE}$ are substantially less than the lowest production values encountered for the NPN transistor $V_{BE}$. Typically, the $\Delta V_{BE}$ at 25° C. can be set to about 100 mv. In the course of typical IC manufacturing this value can be expected to range over about 80–120 mv.

In the circuit of FIG. 1, $V_{IN}$ is clamped at the relatively low potential of about 100 mv. $V_{OUT}$ will be operative at substantially any value above $V_{SAT}$ up to $+V$. The bias current in transistor 14 is determined by dividing $V_{IN}$ by the value of resistor 17. Since current source 16 establishes the emitter current, it is only necessary to set the ratio $I_1/I_{BIAS}$ to a value that is less than the Beta of transistor 14.

The relative sizes of the emitters of transistors 12 and 14 are determined as follows. The lowest value of $I_{OUT}$ is established and a value of $I_1$ is selected. For example, a minimum $I_{OUT}$ of ten times $I_1$ can be established. If the emitter areas of transistors 12 and 14 are equal, this will produce a 25° C. $\Delta V_{BE}$ of about 60 millivolts. If the emitters are area ratioed so that transistor 12 is about 1/5 the area of transistor 14, a $\Delta V_{BE}$ of about 102 millivolts is obtained.

The highest potential point in the circuit is the base of transistor 12 which is at one $V_{BE}$. The entire circuit will operate at voltages as low as $V_{BE}+V_{SAT}$. The $V_{SAT}$ is needed to operate current source 16. The minimum voltage is about 0.9 volt at 25° C. and is under about 1.1 volts over a temperature range of −55° C. to +125° C. Thus, the circuit is operable at a voltage that can be supplied by a single cell battery. There is no upper operating voltage limit except the collector breakdown voltages of the transistors which is typically in the range of 40 to 60 volts for convention IC devices.

FIG. 2 shows a compound buffer inverter with boost. The basic circuit is as was described for FIG. 1 and the circuit designations are the same. Three transistors 17-19 have been added. Transistors 17 and 18 are of conventional lateral construction and form a current mirror which reflects the collector current of transistor 19. Transistor 19 is driven in parallel with the base of transistor 12. As transistor 12 is driven more conductive, the increased voltage turns 19 on harder. This results in more base drive current from transistor 18. Thus, the added circuit acts to boost the base current drive capability of the current without resorting to larger transistor geometry or greater idling current which would act to reduce the $\Delta V_{BE}$. Resistor 20, which degenerates the gain of transistor 19, controls the degree of boost present.

FIG. 3 shows a class B amplifier output stage using the compound buffer inverter. Complementary transistors 25 and 26 are large area devices designed to supply suitable output power to a load device (not shown) coupled to terminal 13. The object of this circuit is to permit very low voltage operation with an output signal swing that closely approaches the power supply rail potentials of +V and −V.

Output sinking transistor 25 operates in conjunction with complementary transistor 27 as a compound buffer inverter. Current source 28 biases the buffer inverter and resistor 29 determines the input current. Transistor 35 drives the buffer from circuit node 30 which operates at about one $V_{BE}$ plus about 0.1 volt (at 25° C.) above −V.

Transistors 31-33 along with resistor 34 comprise a booster circuit operating at the base of transistor 25 as was described in connection with FIG. 2. Transistor 36 drives circuit node 30 from the $V_{IN}$ terminal 37. Thus, $V_{OUT}$ will be in phase with $V_{IN}$.

Transistor 26, the output sourcing transistor, is typically PNP device of lateral construction. Such devices require greater drive to achieve a conduction that equals the NPN transistor 25. Transistor 40 directly drives the base of transistor 26. Since transistor 40 is of common emitter configuration, it provides a signal inversion. A second compound buffer inverter which includes transistors 41 and 42 drives transistor 40 and provides a signal inversion so that transistor 26 is driven in the correct phase. Transistor 43 acts as a current source to bias the second compound buffer inverter with the bias being set by the potential of the base of transistor 26. In effect, transistor 43 operating with diode connected transistor 45 forms a current mirror to bias the second compound buffer inverter, current source 46 sets a bias current for the amplifying section of the drive circuitry and transistor 40 in conjunction with diode connected transistor 47 mirrors this current to bias the base of transistor 26. It can be seen that transistor 43 inverts and feeds the output from transistor 40 back to the base of transistor 42. This degenerative feedback loop limits the gain of the cascaded common emitter transistors 40 and 42 and stabilizes the circuit operating point. Resistor 44 degenerates the gain of transistor 44 and thus, controls the feedback. Diode connected transistor 47 with series resistor 48 shunts the input to transistor 40 and acts as a gain reducing element in the common emitter cascade. Diode connected transistor 45 also acts as a gain reducing element. Resistor 49 determines the current from node 50 to −V. Emitter follower driver 51 provides the input drive to the second compound buffer inverter from node 52.

Thus, node 52 effectively drives PNP transistor 26 while node 30 drives NPN transistor 25. Both nodes 30 and 52 are driven in phase by transistor 36 from $V_{IN}$ at terminal 37. However, current source 53 establishes the collector current in transistor 36 and the current in resistor 54. The voltage drop across resistor 54 which is typically made to be about 0.2 volt, offsets the dc voltages at nodes 30 and 52 and thereby establishes the quiescent or zero-signal current in output transistors 25 and 26.

EXAMPLE

The simplified circuit of FIG. 3 has been incorporated into a commercial product identified as LM10. The following table shows the component values associated with the various parts.

| Component | Value | Units |
| --- | --- | --- |
| Current Source 28 | 5 | Microamperes |
| Resistor 29 | 22 | Kohms |
| Resistor 34 | 100 | Ohms |
| Resistor 44 | 20 | Kohms |
| Current Source 46 | 40 | Microamperes |
| Resistor 48 | 40 | Kohms |
| Resistor 49 | 20 | Kohms |
| Current Source 53 | 20 | Microamperes |
| Resistor 54 | 10 | Kohms |

The IC draws a zero signal current of only 270 microamperes and will deliver a 20 milliampere output with a saturation voltage of 0.4. This means that with a 20 ma. load, the output voltage will swing within 0.4 volt of the supply rails. Unloaded the output swing is to within 0.01 volt of supply rails. The circuit operates from a 1.1 volt supply down to −55° C.

The invention has been described and a practical embodiment detailed. Upon reading the above disclosure, it is clear that a person skilled in the art will recognize alternatives and equivalents that are within the spirit and intent of the invention. For example, while the devices shown reflect the present state of the art in IC construction, in which it is preferred that a vertical PNP transistor drives a vertical NPN, the device types can be complemented and the power supply polarity reversed. Accordingly, it is intended that the scope of the invention be limited only by the claims that follow.

I claim:

1. A compoud buffer inverter for use in an integrated circuit that employs a single power supply connectible between first and second supply rails and that is particularly adapted for operation at low power supply voltages, said compound buffer inverter being operative to provide substantial current gain with a single signal polarity inversion and level shifting capability, said compound buffer inverter comprising:

a first transistor having its emitter coupled to said first rail, its collector providing a current output terminal capable of assuming a potential between said first and second rails and a base;

a second transistor complementary of said first transistor, said second transistor having a collector coupled to said first rail, an emitter coupled to said base of first transistor, and a base coupled to a circuit input terminal;

current supply means coupled between said base of said first transistor and said second rail;

means for operating said first transistor such that its emitter base potential is equal to or greater than the emitter base potential of said second transistor;

and means for boosting the bias current to said first and second transistors with increasing load current.

2. The combination of claim 1 wherein said means for boosting comprise:

a third transistor of the same conductivity type as said first transistor and having an emitter and base directly coupled respectively to the emitter and base of said first transistor; and a current motor connected to said second rail, said current mirror having an input coupled to the collector of said third transistor and an output coupled to the base of said first transistor.

3. The combination of claim 2 wherein said current mirror comprises:

a fourth transistor having a conductivity type of that of said second transistor, an emitter coupled to said second rail and a collector and a base coupled together to said collector of said third transistor; and a fifth transistor having a conductivity type of that of said fourth transistor, a base coupled to said base of said fourth transistor, an emitter coupled to said second rail, and a collected coupled to said base of said first transistor.

4. The combination of claim 3 in further combination with a fifth transistor complementary to said first transistor and operative therewith to form a class B output stage, said fifth transistor having an emitter coupled to said second rail, a collected coupled to said collected of said first transistor to comprise the output of said stage and a base coupled to means for driving said fifth transistor in the same phase as said first transistor.

5. A monolithic integrated circuit having opposite and negative rails connectible to a single source of operating potential, said circuit comprising:

a first NPN transistor having its collector emitter circuit coupled to act a current sink between an output terminal and said negative rail and a base;

a second PNP transistor having its emitter collector circuit coupled to act as a current sink between said base of said first transistor and said negative rail and a base;

a current supply source coupled between said positive rail and said collector emitter circuit of said second transistor;

means for coupling said base of said second transistor to an input terminal;

means for operating said first transistor at a higher current density than said first transistor whereby said base of said second transistor operates at a potential close to and above said negative rail and there is substantial gain between said input and output terminals;

a third NPN transistor having an emitter base circuit coupled in parallel with the emitter base circuit of said first transistor and a collector;

a fourth PNP transistor having its collector and base coupled together and to said collector of said third transistor and its emitter coupled to said positive rail; and a fifth PNP transistor having its base coupled to said collector of said third transistor, its emitter coupled to said positive rail and its collector coupled to said base of said first transistor, whereby the base current drive to said first transistor is boosted as a function of its emitter-base voltage drive.

6. The circit of claim 5 further comprising:

a sixth PNP transistor having its emitter base circuit coupled as a current source between said positive rail and said output terminal and its base coupled to means for driving said first and fifth transistors in phase with a class B output stage.

* * * * *